(12) United States Patent
Li

(10) Patent No.: US 10,653,012 B2
(45) Date of Patent: May 12, 2020

(54) ELECTRONIC DEVICE AND MANUFACTURING METHOD THEREOF

(71) Applicant: GIO Optoelectronics Corp, Tainan (TW)

(72) Inventor: Chin-Tang Li, Tainan (TW)

(73) Assignee: GIO OPTOELECTRONICS CORP., Tainan (TW)

( * ) Notice: Subject to any disclaimer, the term of this patent is extended or adjusted under 35 U.S.C. 154(b) by 0 days.

(21) Appl. No.: 16/135,492

(22) Filed: Sep. 19, 2018

(65) Prior Publication Data
US 2019/0124764 A1 Apr. 25, 2019

(30) Foreign Application Priority Data
Oct. 24, 2017 (TW) .............................. 106136523 A

(51) Int. Cl.
| | |
|---|---|
| H05K 1/18 | (2006.01) |
| H05K 1/11 | (2006.01) |
| H05K 3/40 | (2006.01) |
| H05K 3/32 | (2006.01) |
| H05K 3/00 | (2006.01) |
| H05K 1/03 | (2006.01) |

(52) U.S. Cl.
CPC .............. *H05K 1/111* (2013.01); *H05K 1/118* (2013.01); *H05K 1/189* (2013.01); *H05K 3/32* (2013.01); *H05K 3/321* (2013.01); *H05K 3/4076* (2013.01); *H01L 2224/16225* (2013.01); *H05K 1/0313* (2013.01); *H05K 3/007* (2013.01); *H05K 2201/0179* (2013.01); *H05K 2201/0338* (2013.01); *H05K 2201/0373* (2013.01); *H05K 2203/0353* (2013.01)

(58) Field of Classification Search
CPC .................................. H05K 1/181; H05K 1/18
See application file for complete search history.

(56) References Cited

U.S. PATENT DOCUMENTS

| | | | | |
|---|---|---|---|---|
| 5,035,837 A | * | 7/1991 | Saeki .................... | B22F 1/0059 106/1.13 |
| 6,050,832 A | * | 4/2000 | Lee .................... | H01L 23/49833 257/E23.063 |
| 6,542,374 B1 | | 4/2003 | Muramatsu et al. | |
| 2004/0235227 A1 | | 11/2004 | Kawase | |
| 2010/0132997 A1 | * | 6/2010 | Hando .............. | H01L 23/49816 174/262 |
| 2010/0258341 A1 | | 10/2010 | Sagawa et al. | |

(Continued)

*Primary Examiner* — Jeremy C Norris
(74) *Attorney, Agent, or Firm* — Muncy, Geissler, Olds & Lowe, PC

(57) ABSTRACT

An electronic device and manufacturing method thereof are disclosed. The manufacturing method of the electronic device comprises following steps: forming at least a thin-film conductive line on the substrate by a thin-film process; forming at least an electrical connection pad on the substrate by a printing process, wherein the electrical connection pad is electrically connected with the thin-film conductive line; and disposing at least an electronic element on the substrate, wherein the electronic element is electrically connected with the thin-film conductive line through the electrical connection pad. The electronic device has a lower manufacturing cost and a higher component configuration density, and the production yield and reliability of the electronic device are improved by the configuration of the electrical connection pad.

20 Claims, 8 Drawing Sheets

(56) References Cited

U.S. PATENT DOCUMENTS

2015/0003024 A1    1/2015  Huang et al.
2015/0156873 A1    6/2015  Yoshioka et al.
2016/0338199 A1* 11/2016  Hua ...................... H01R 12/52
2019/0109084 A1*  4/2019  Brunschwiler ... H01L 23/49838

* cited by examiner

ELECTRONIC DEVICE AND MANUFACTURING METHOD THEREOF

CROSS REFERENCE TO RELATED APPLICATIONS

This Non-provisional application claims priority under 35 U.S.C. § 119(a) on Patent Application No(s). 106136523 filed in Taiwan, Republic of China on Oct. 24, 2017, the entire contents of which are hereby incorporated by reference.

BACKGROUND

Technology Field

The present disclosure relates to an electronic device and, in particular, to an electronic device and a manufacturing method thereof.

Description of Related Art

In the conventional manufacturing process of the semiconductor electronic device (e.g. an LED display), the conductive lines disposed on the circuit substrate must be made with a certain thickness (generally greater than 3 μm) for connecting the circuit substrate to an electronic element. However, the conductive lines made by the general semiconductor thin-film process usually have a thinner thickness (generally less than 3 μm). Accordingly, the conductive lines made by the general semiconductor thin-film process cannot be directly used for electrically connecting the electronic element to the circuit substrate.

SUMMARY

An objective of this disclosure is to provide an electronic device and a manufacturing method thereof that configure an electrical connection pad for electrically connecting an electronic element to the thin-film conductive line disposed on the circuit board.

This disclosure provides an electronic device comprising a circuit board and at least an electronic element. The circuit board comprises a substrate, at least a thin-film conductive line and at least an electrical connection pad. The thin-film conductive line and the electrical connection pad are disposed on the substrate. The electrical connection pad is electrically connected with the thin-film conductive line. The electronic element is disposed on the electrical connection pad and electrically connected with the thin-film conductive line via the electrical connection pad.

The present disclosure also provides an electronic device comprising a circuit board and at least an electronic element. The circuit board comprises a flexible substrate, at least a thin-film conductive line and at least an electrical connection pad. The thin-film conductive line and the electrical connection pad are disposed on the flexible substrate. The electrical connection pad is electrically connected with the thin-film conductive line. The electronic element is disposed on the electrical connection pad and electrically connected with the thin-film conductive line via the electrical connection pad.

In one embodiment, the electronic element is electrically connected with the electrical connection pad by eutectic bonding.

In embodiment, the substrate is a flexible substrate or a hard substrate.

In one embodiment, the flexible substrate comprises an organic polymer material, and a glass transition temperature of the organic polymer material is between 250° C. and 600° C.

In one embodiment, a width of at least a part of the thin-film conductive line is between 1 μm and 10 μm.

In one embodiment, a thickness of the thin-film conductive line is less than 3 μm.

In one embodiment, a thickness of the electrical connection pad is between 3 μm and 20 μm.

In one embodiment, a material of the electrical connection pad comprises copper powder and polymer material.

In one embodiment, a porosity of the electrical connection pad is greater than or equal to 5%, and is less than or equal to 40%.

In one embodiment, the electronic device further comprises an insulation layer covering at least a part of the thin-film conductive line.

In one embodiment, the electrical connection pad comprises a body portion and an extension portion, the electronic element is connected to the body portion, and the extension portion is connected to the thin-film conductive line.

In one embodiment, a width or a thickness of the body portion is different from a width or a thickness of the extension portion.

In one embodiment, the extension portion at least partially covers the thin-film conductive line.

In one embodiment, the electronic element is an SMD, an IC or a control circuit board.

In one embodiment, the electronic device further comprises a conductive material disposed on the substrate. An electrode of the electronic element is electrically connected with the electrical connection pad and the thin-film conductive line via the conductive material.

This disclosure further provides a manufacturing method of an electronic device, comprising steps of: forming at least a thin-film conductive line on a substrate by a thin-film process; forming at least an electrical connection pad on the substrate by a printing process, wherein the electrical connection pad is electrically connected with the thin-film conductive line; and disposing at least an electronic element on the substrate, wherein the electronic element is electrically connected with the thin-film conductive line through the electrical connection pad.

In one embodiment, the manufacturing method further comprises a step of: forming the substrate on a rigid carrier plate.

In one embodiment, the manufacturing method further comprises a step of: forming an insulation layer on the substrate, wherein the insulation layer at least partially covers the thin-film conductive line.

In one embodiment, the printing process is a non-vacuum printing process.

In one embodiment, the manufacturing method further comprises a step of: performing multiple times of the printing process for increasing a width or a thickness of the electrical connection pad.

As mentioned above, in the electronic device and the manufacturing method thereof of this disclosure, at least a thin-film conductive line is formed on the substrate by a thin-film process, and at least an electrical connection pad electrically connected with the thin-film conductive line is formed on the substrate by a printing process. Afterwards, at least an electronic element is disposed on the substrate, and the electronic element can be electrically connected with the thin-film conductive line via the electrical connection pad. Since thin-film conductive line and the electrical connection pad are formed on the substrate by a thin-film process and a printing process, respectively, and the electronic element is electrically connected with the thin-film conductive line via the electrical connection pad, many fine lines can be manufactured based on this disclosure. Accordingly, this disclosure can decrease the manufacturing cost of the electronic device, increase the component configuration density, and improve the production yield and reliability of the electronic device.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

For example, the electronic device in the following embodiments can be an LED display, a micro-LED display, a sensing device (e.g. fingerprint sensor, fingerprint reader, or an X-ray sensor), a semiconductor device, or an illumination device, and this disclosure is not limited thereto.

Figure 1:
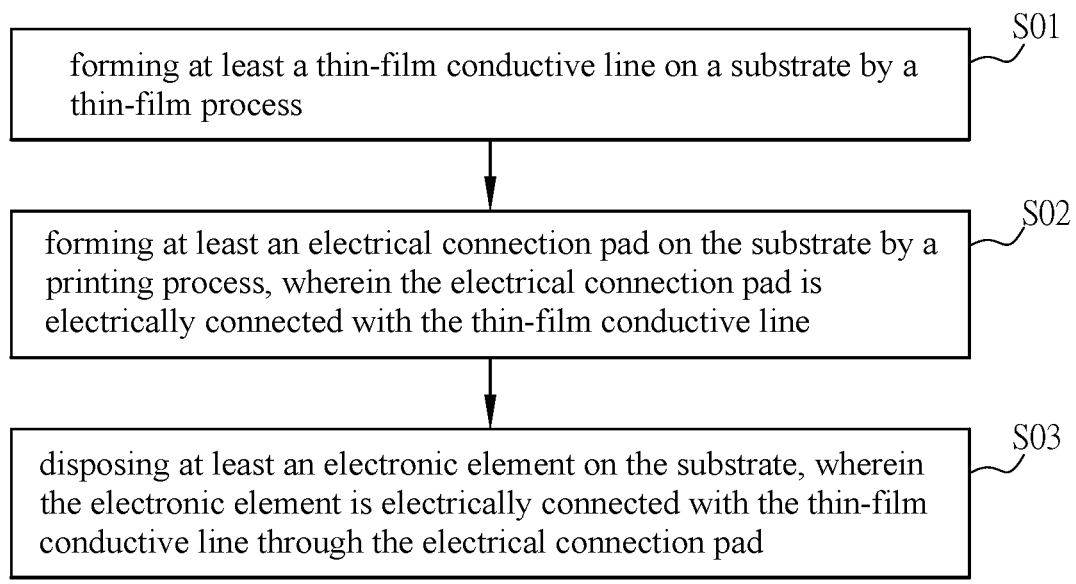
FIG. 1 is a flow chart showing a manufacturing method of an electronic device according to an embodiment of this disclosure.

FIG. 1 is a flow chart showing a manufacturing method of an electronic device according to an embodiment of this disclosure.

As shown in FIG. 1, the manufacturing method of an electronic device comprises the following steps of: forming at least a thin-film conductive line on a substrate by a thin-film process (step S01); forming at least an electrical connection pad on the substrate by a printing process, wherein the electrical connection pad is electrically connected with the thin-film conductive line (step S02); and disposing at least an electronic element on the substrate, wherein the electronic element is electrically connected with the thin-film conductive line through the electrical connection pad (step S03).

As mentioned above, the substrate 11 is a flexible substrate or a hard substrate. In some embodiments, if the substrate 11 is a flexible substrate, a step for disposing the (flexible) substrate 11 on a rigid carrier plate is needed before the step S01, and a step for removing the rigid carrier plate will be performed after the step S03. The configuration of the rigid carrier plate can assist to form the required components on the flexible substrate 11 by the thin-film process and/or the printing process. If the substrate 11 is a hard substrate, the above-mentioned two additional steps are not needed.

The above-mentioned steps will be further described with reference to FIG. 1 in view of FIGS. 2A to 2E. FIGS. 2A to 2E are schematic diagrams showing the manufacturing procedures of the electronic device 1 according to an embodiment of this disclosure.

If the substrate 11 is a hard substrate, it can be a glass substrate, a metal substrate, a resin substrate, or a composite substrate. If the substrate 11 is a flexible substrate, it can comprise organic polymer material. The glass transition temperature (Tg) of the organic polymer material is, for example, between 250° C. and 600° C., and preferably between 300° C. and 500° C. Since the organic polymer material has a relative higher glass transition temperature, the substrate 11 can be used in the following thin-film process. The organic polymer material can be a thermal solidification material, such as polyimide (PI), polyethylene (PE), polyvinylchloride (PVC), polystyrene (PS), acrylic, fluoropolymer, polyester, or nylon.

Figure 2A:
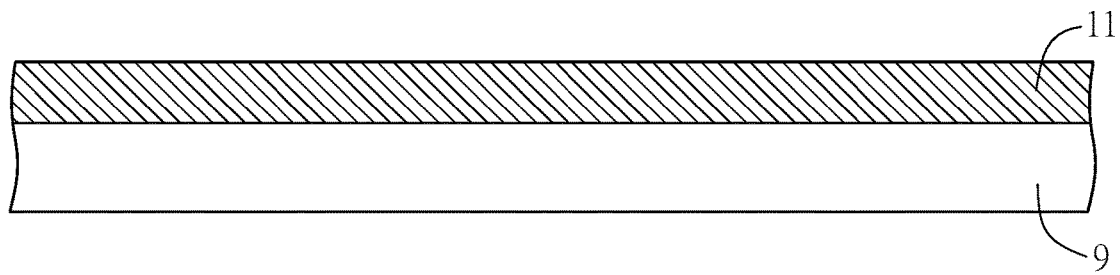
FIGS. 2A to 2F are schematic diagrams showing the manufacturing procedures of the electronic device according to an embodiment of this disclosure.

In this embodiment, the substrate 11 is a flexible substrate, and the material thereof is polyimide (PI). Therefore, as shown in FIG. 2A, the flexible substrate (the substrate 11) is formed on a rigid carrier plate 9. The rigid carrier plate 9 can be made of transparent or nontransparent material, such as, for example but not limited to, a glass plate, a ceramic plate, a metal plate, or a quartz plate. The material of the substrate 11 (flexible substrate) is disposed on the rigid carrier plate 9 by gluing or dispensing, and then cured (by thermal solidification or light curing) to form the substrate 11 on the rigid carrier plate 9. In the case of disposing the substrate 11 on the rigid carrier plate 9 by gluing, an adhesive layer (not shown) is applied on the rigid carrier plate 9, and then the flexible substrate is attached on the adhesive layer 91. After the following laminating process and curing process, the substrate 11 can be formed on the rigid carrier plate 9. The material of the adhesive layer 91 can be, for example but not limited to, epoxy or silane coupling agent (SCA). Alternatively, if the flexible substrate is formed by dispensing, the organic polymer material can be applied on the rigid carrier plate 9 directly. After curing the organic polymer material, a layer of flexible substrate (the substrate 11) can be formed on the rigid carrier plate 9.

Figure 2B:
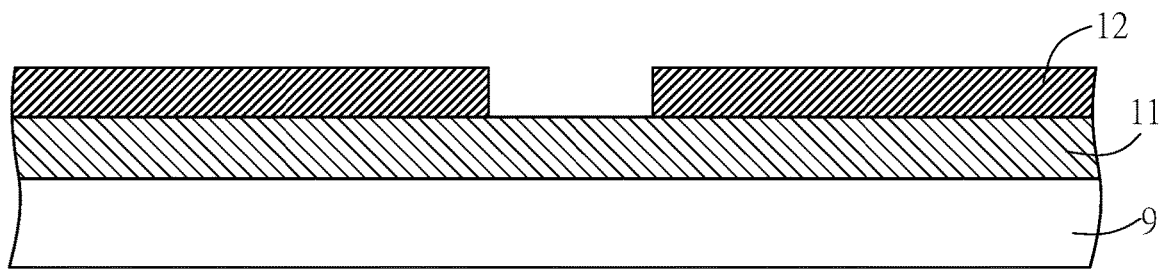

Next, as shown in FIG. 2B, the step S01 is performed to form at least a thin-film conductive line 12 on the substrate 11 by a thin-film process. In this step, the thin-film process can be a semiconductor process, which comprises a low-temperature polycrystalline silicon (LTPS) process, an amorphous silicon (a-Si) process, or a metal oxide semiconductor process (e.g. IGZO). The thin-film conductive line 12 can be a single-layer structure or a multilayer structure made of metal (e.g. aluminum, copper, silver, molybdenum, or titanium) or an alloy thereof. In this embodiment, a conductive layer is formed on the substrate 11 by a thin-film process, and then at least one thin-film conductive line 12 is manufactured by processing the conductive layer by lithography, developing and etching. Herein, a width of at least a part of the thin-film conductive line 12 is between 1 μm and 10 μm, and a thickness of the thin-film conductive line is less than 3 μm. This configuration can increase the component configuration density on the thin-film conductive line 12. In one embodiment, the width of at least a part of the thin-film conductive line 12 is between 1 μm and 400 μm. When applying a 20 mA current to the flexible substrate (e.g. PI), if the thickness of the thin-film conductive line 12 is 3 μm, the width thereof must be 120 μm. If the thickness of the thin-film conductive line 12 is 1 μm, the width thereof must be 360 μm for withstanding the applied 20 mA current. In this embodiment, two separated thin-film conductive lines 12 are formed on the substrate 11. In some embodiments, more thin-film conductive lines 12 can be formed on the substrate 11 based on the design requirement for the sake of disposing a plurality of electrical connection pads and a plurality of electronic elements.

Figure 2C:
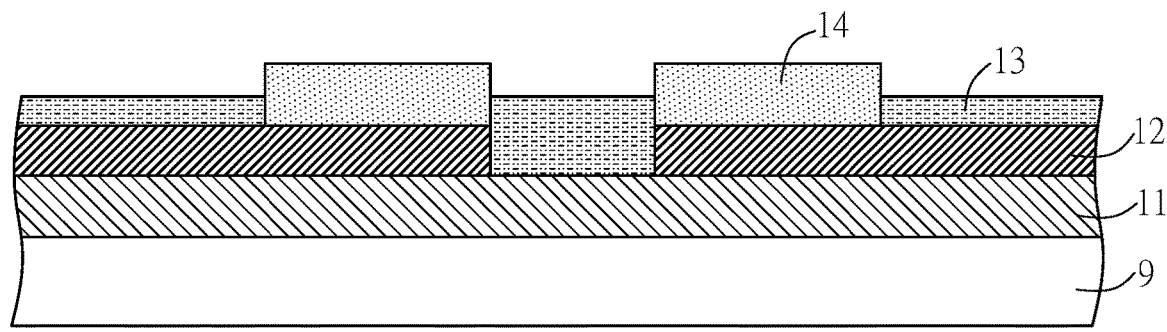

Afterwards, as shown in FIG. 2C, the step S02 is performed to form at least an electrical connection pad 14 on the substrate 11 by a printing process, wherein the electrical connection pad 14 is electrically connected with the thin-film conductive line 12. In this embodiment, two electrical connection pads 14 are formed on two thin-film conductive lines 12, respectively, and each electrical connection pad 14 is electrically connected with the corresponding thin-film conductive line 12. The configuration can provide a sufficient adhesive for disposing the following electronic element, and thus decrease the material cost. The printing process can be a vacuum printing process or a non-vacuum printing process. Herein, the printing process is a non-vacuum printing process. The material of the electrical connection pad 14 comprises, for example, copper powder or a polymer material. In this embodiment, the copper powder is mixed in a binder made of polymer material (e.g. epoxy) so as to obtain a copper paste, and then the copper paste is formed on the thin-film conductive line 12 by a printing process (for example but not limited to a jet printing process or a 3D printing process). Then, a surface treatment is applied to increase the adhesion between the electrical connection pad 14 and the solder material (e.g. Sn balls or Au bumps).

To be noted, if a larger current is applied to flow through the electrical connection pad 14, the electrical connection pad 14 must be made wider or thicker. Accordingly, the manufacturing method of this disclosure may further comprise a step of: performing multiple times of the printing process for increasing a width or a thickness of the electrical connection pad 14. In some embodiments, the thickness of the electrical connection pad 14 is greater than or equal to 3 μm, and is between 3 μm and 20 μm. In some embodiments, since the polymer material is added, the porosity of the electrical connection pad 14 is greater than or equal to 5%, and is less than or equal to 40% (5%≤porosity≤40%).

Next, before the step S03, as shown in FIG. 2C, another step can be performed to form an insulation layer 13 on the substrate 11, wherein the insulation layer 13 covers at least a part of the thin-film conductive line 12. In this embodiment, the insulation layer 13 can be formed on the substrate 11 by, for example, a thin-film process for covering a part of the thin-film conductive line 12 or covering a part of the thin-film conductive line 12 and a part of the substrate 11. Herein, the thickness of the electrical connection pad 14 can be greater than or equal to the thickness of the insulation layer 13. To be noted, after forming the thin-film conductive line 12, the electrical connection pad 14 and the insulation layer 13 are formed in order. Alternatively, after forming the thin-film conductive line 12, it is also possible to form the insulation layer 13 and the electrical connection pad 14 in order. This disclosure is not limited thereto.

Figure 2D:
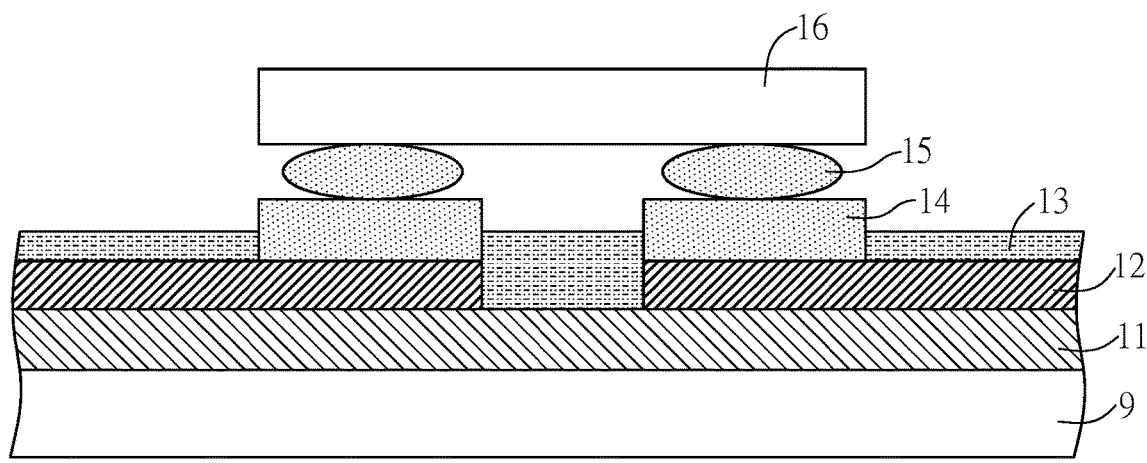

Afterwards, as shown in FIG. 2D, the step S03 is performed to dispose at least an electronic element 16 on the substrate 11, wherein the electronic element 16 is electrically connected with the thin-film conductive line 12 through the electrical connection pad 14. The electronic element 16 and the electrical connection pad 14 can be connected by SMT (surface mount technology), eutectic bonding (e.g. Au—Sn), non-conductive paste (NCP) bonding, ACF (anisotropic conductive film) bonding, ACP (anisotropic conductive paste) bonding, solder ball bonding, or ultrasonic bonding, and this disclosure is not limited thereto.

In some embodiments, the electronic element 16 can be an SMD (surface mounted device) such as a bipolar element, which includes, for example but not limited to, LED, μLED, photo diode, or image sensor. In some embodiments, the electronic element 16 can also be a tripolar element such as a transistor. In some embodiments, the electronic element 16 can be an IC (integrated circuit) or a control circuit board (flexible or hard board), and this disclosure is not limited.

In this embodiment, the electronic element 16 is an SMD. The two electrodes of the electronic element 16 is disposed on the electrical connection pads 14 by SMT for electrically connecting the electronic element 16 and the thin-film conductive lines 12 via a conductive material 15 and the electrical connection pads 14. In some embodiments, the conductive material 15 (solder ball or Au bump) can be heated and melted for electrically connecting the two electrodes of the electronic element 16 and the thin-film conductive lines 12 via the conductive material 15 and the electrical connection pads 14. In the electronic device 1 of this embodiment, the thin-film conductive lines and the electrical connection pads are formed by the thin-film process and the printing process, respectively, and then the electronic element 16 is disposed on the substrate 11 by SMT. Accordingly, this disclosure can decrease the manufacturing cost of the electronic device 1, increase the component configuration density, and improve the production yield and reliability of the electronic device 1.

In some embodiments, the width of a part of the thin-film conductive lines 12 is between 1 μm and 400 μm. In the case that the thickness of the thin-film conductive lines 12 is 0.6 μm, when applying a 5 mA current, the width of the thin-film conductive lines 12 must be 150 μm. Accordingly, there are two ways to connect with the electronic element 16. In the first way, the thin-film conductive line 12 is made with a thickness of 0.6 μm and a width of 150 μm, and then the electrical connection pads 14 (e.g. a copper paste) is printed at the connection portion of the electronic element 16. In this second way, the thin-film conductive line 12 is made with a thickness of 0.6 μm and a width of 10 μm, and then an extension portion along with the electrical connection pads 14 are formed by multiple printing processes for covering the thin-film conductive line 12. Accordingly, the electrical connection pads 14 can be connected with the thin-film conductive line 12, thereby increasing the conductivity of the electrical connection pads 14 and the thin-film conductive line 12, so that they can withstand the 5 mA current.

Figure 2E:
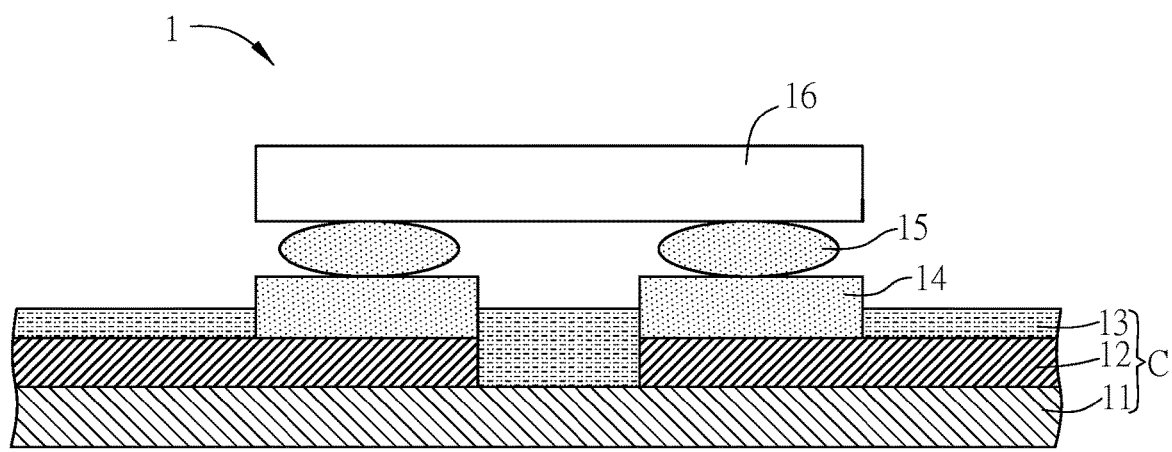

Finally, in this embodiment as shown in FIG. 2E, the rigid carrier plate 9 is removed. In this embodiment, the rigid carrier plate 9 can be removed by laser lift-off or mechanical lift-off, and then an SOF (system on film) electronic device 1 can be obtained.

As shown in FIGS. 2A to 2E, the substrate 11 of the electronic device 1 is flexible substrate for example. To be noted, the other technical features (e.g. the width and thickness of the thin-film conductive line, the thickness, material and porosity of the electrical connection pad, and the kinds of the insulation layer and the electronic element) of the electronic device 1 can be applied to the electronic device with a hard substrate.

Figure 2F:
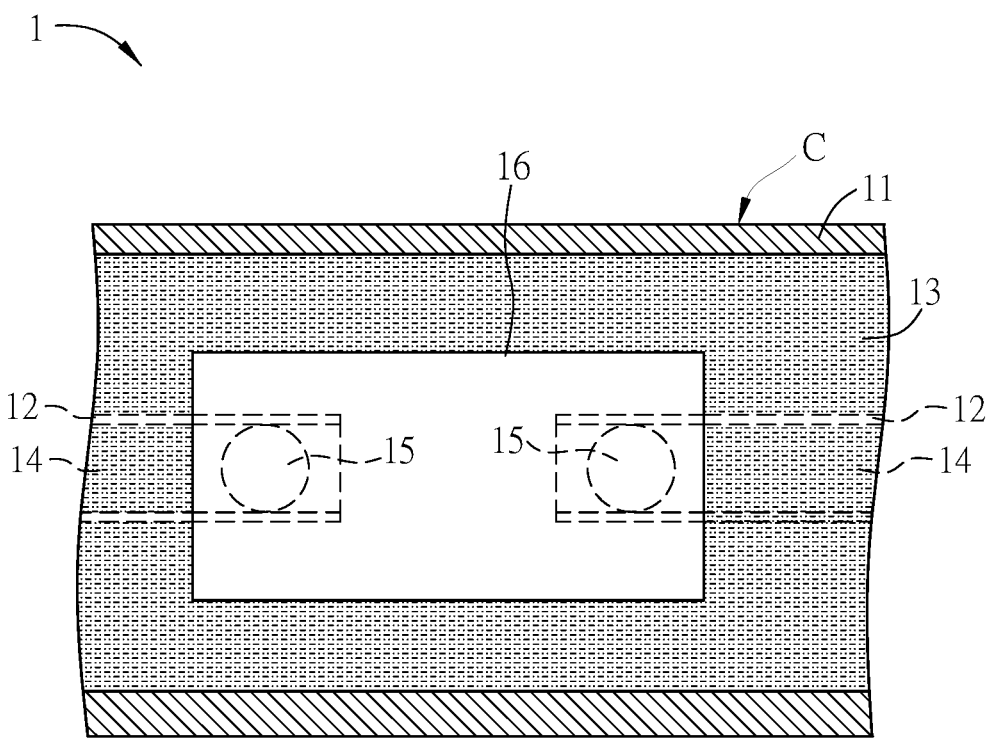

FIG. 2F is a top view showing a part of the electronic device 1 of FIG. 2E. As shown in FIGS. 2E and 2F, the electronic device 1 may comprise a circuit board C and at least one electronic element 16. The circuit board C comprises a substrate 11, at least one thin-film conductive line 12, and at least one electrical connection pad 14. The thin-film conductive line 12 and the electrical connection pad 14 are disposed on the substrate 11. The electrical connection pad 14 is electrically connected with the thin-film conductive line 12. The electronic element 16 is disposed on the electrical connection pad 14 and electrically connected with the thin-film conductive line 12 via the electrical connection pad 14. Since thin-film conductive line 12 and the electrical connection pad 14 are formed on the substrate 11 by a thin-film process and a printing process, respectively, and the electronic element 16 is electrically connected with the thin-film conductive line 12 via the electrical connection pad 14, many fine lines can be manufactured based on this disclosure. Accordingly, this disclosure can decrease the manufacturing cost of the electronic device 1, increase the component configuration density of the electronic elements 16, and improve the production yield and reliability of the electronic device 1. In addition, in some embodiments, the electronic element 16 can be electrically connected with the electrical connection pad 14 by eutectic bonding, and then electrically connected with the thin-film conductive line 12 via the electrical connection pad 14. In some embodiments, the substrate 11 is a flexible substrate, so that the electronic device 1 can also be flexible.

FIGS. 3A to 3B, 4A to 4B, 5, and 6A to 6B are schematic diagrams showing different aspects of the electronic devices 1a~1e according to the embodiment of this disclosure.

Figure 3A:
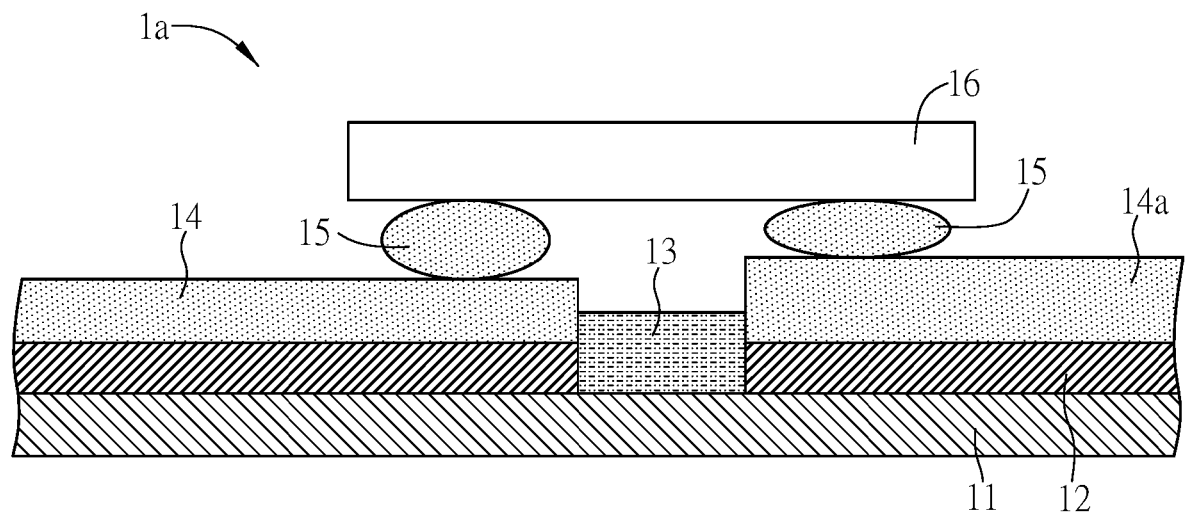
FIGS. 3A to 3B, 4A to 4B, 5, and 6A to 6B are schematic diagrams showing different aspects of the electronic device according to the embodiment of this disclosure.

Different from the electronic device 1, as shown in FIG. 3A, the right-side electrical connection pad 14a of the electronic device 1a is formed by multiple printing processes, so the right-side electrical connection pad 14a is thicker than the left-side electrical connection pad 14. Thus, the right-side electrical connection pad 14a can withstand a larger current. In some embodiments, both sides of the electrical connection pads are formed by multiple printing processes to provide the thicker electrical connection pads 14a.

Figure 3B:
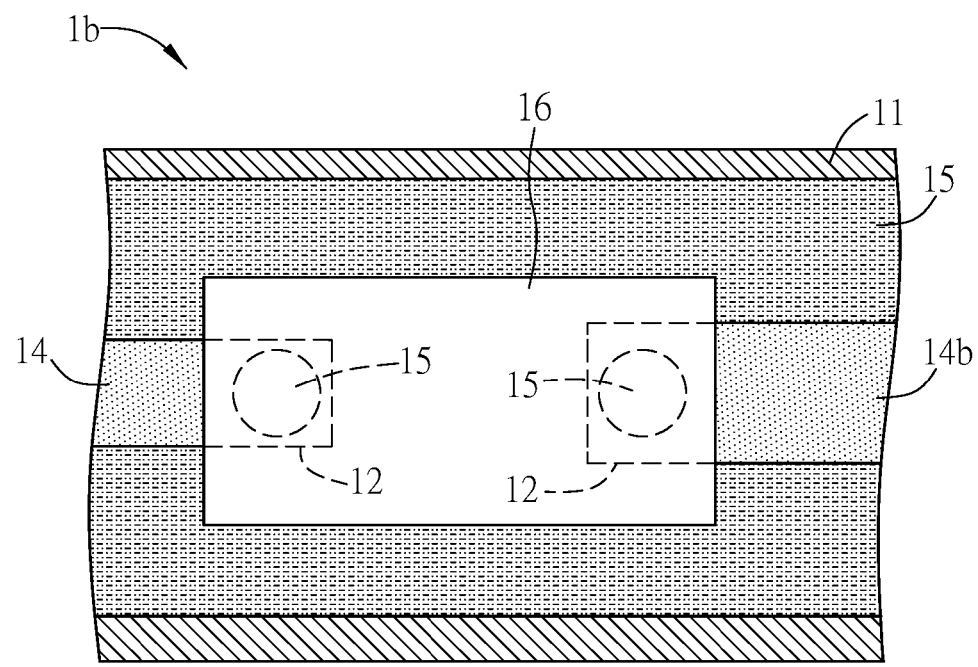

In addition, as shown in FIG. 3B, the right-side electrical connection pad 14b of the electronic device 1b is formed by multiple printing processes, and the width of the right-side electrical connection pad 14b is greater than the left-side electrical connection pad 14. Thus, the right-side electrical connection pad 14b can withstand a larger current. In some embodiments, both sides of the electrical connection pads are formed by multiple printing processes to provide the wider electrical connection pads 14b.

Figure 4A:
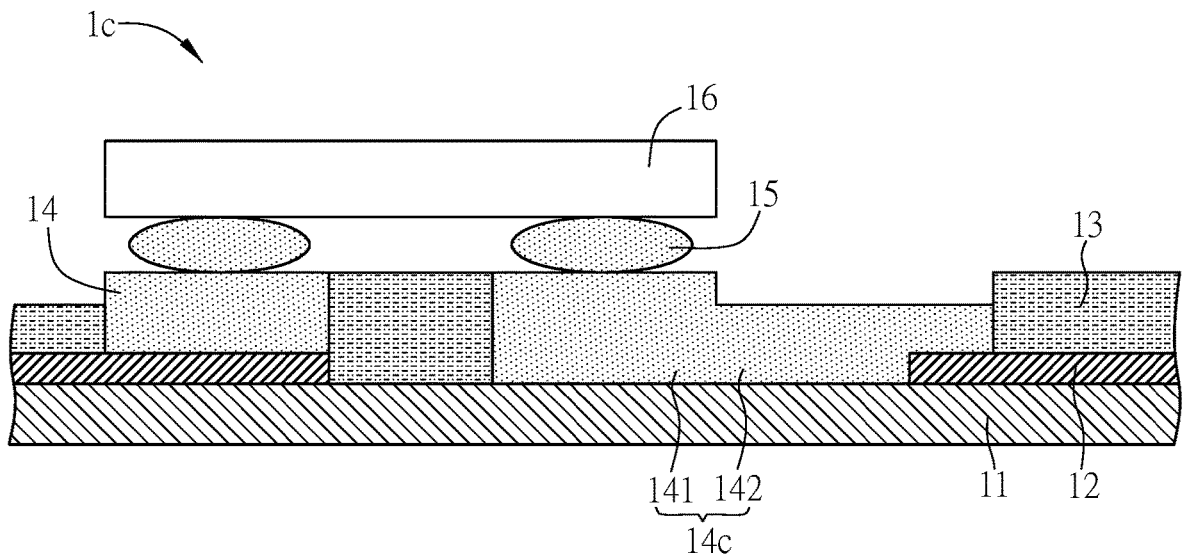
Figure 4B:
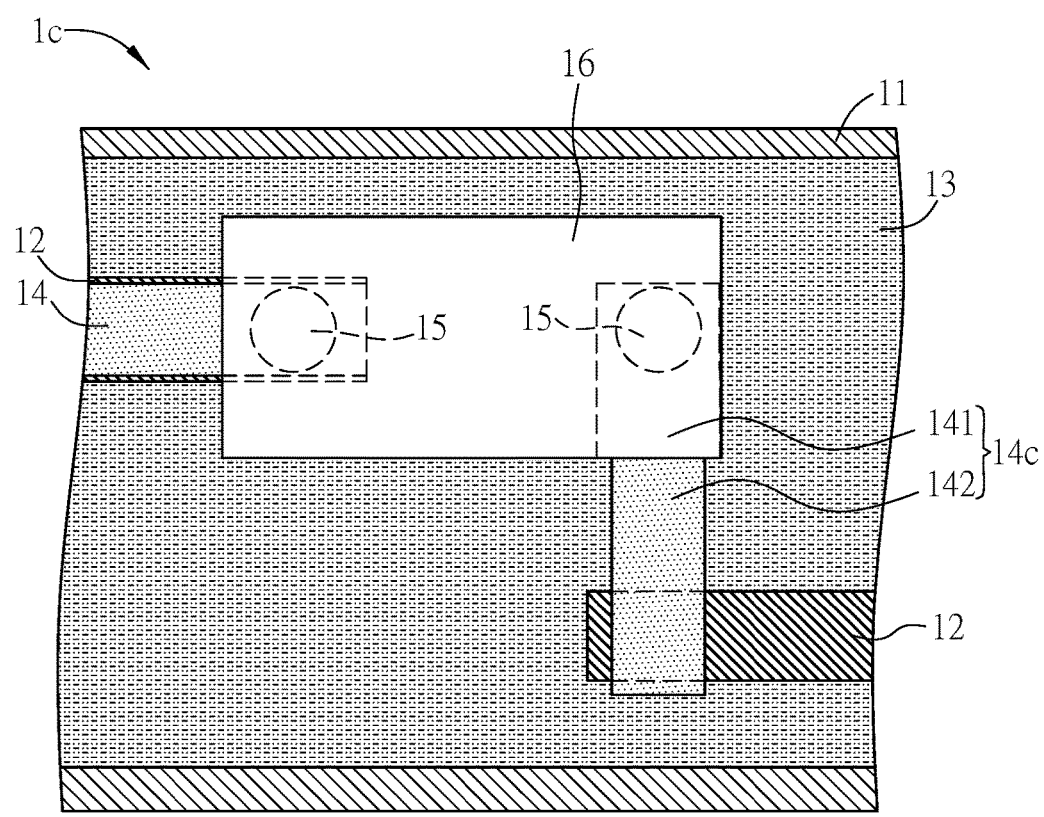

FIGS. 4A and 4B are the sectional view and partial top view of the electronic device 1c according to the embodiment of this disclosure. As shown in FIGS. 4A and 4B, the right-side electrical connection pad 14c of the electronic device 1c comprises a body portion 141 and an extension portion 142. The body portion 141 and an extension portion 142 are disposed on the substrate 11. The electronic element 16 is connected to the body portion 141 through the conductive material 15, and the extension portion 142 at least partially covers the thin-film conductive line 12 and is connected to the thin-film conductive line 12, thereby increasing the conductivity of the electrical connection pad 14c and the thin-film conductive line 12. In the right-side electrical connection pad 14c of the electronic device 1c, the thicknesses of the body portion 141 and the extension portion 142 are different because the right-side electrical connection pad 14c is made by multiple printing processes (the amount of the printing processes for forming the body portion 141 is different from the amount of the printing processes for forming the extension portion 142). In other embodiments, the widths of the body portion 141 and the extension portion 142 of the electrical connection pad 14c can be different by performing multiple printing processes. In addition, the widths and thicknesses of the body portion 141 and the extension portion 142 of the electrical connection pad 14c can be different by performing multiple printing processes. This disclosure is not limited.

Figure 5:
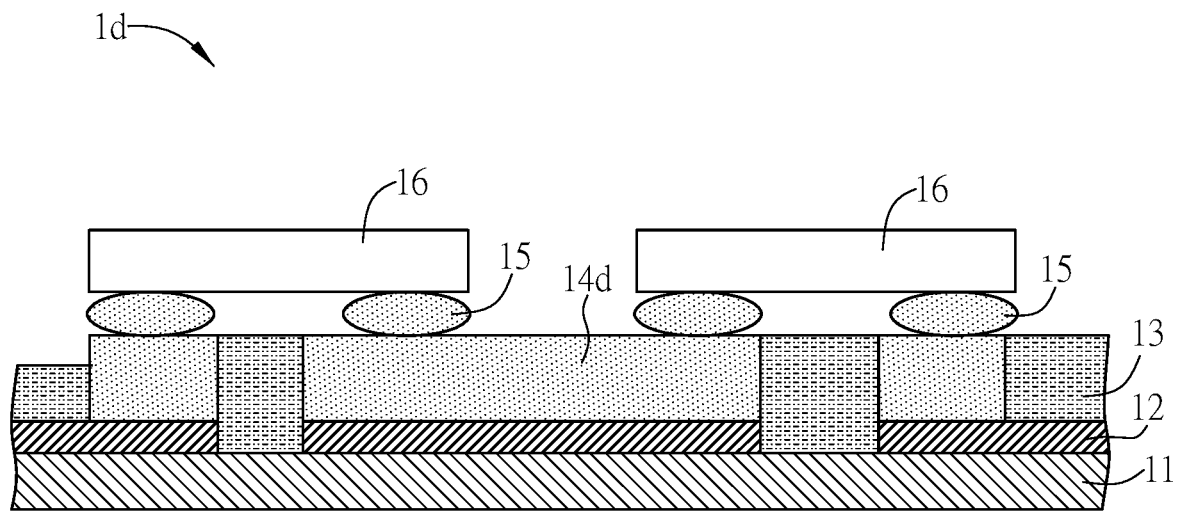

Moreover, as shown in FIG. 5, the electrical connection pad 14d of the electronic device 1d is manufactured by more printing processes, so the thickness thereof is greater than that of the above-mentioned electrical connection pad 14. Thus, the thicker electrical connection pad 14d can withstand a larger current. In addition, the electronic device 1d may have two electronic elements 16, which are electrically connected with the thin-film conductive line 12 through the same one electrical connection pad 14d, so that one electrode of one electronic element 16 can be electrically connected with one electrode of the other electronic element 16.

Figure 6A:
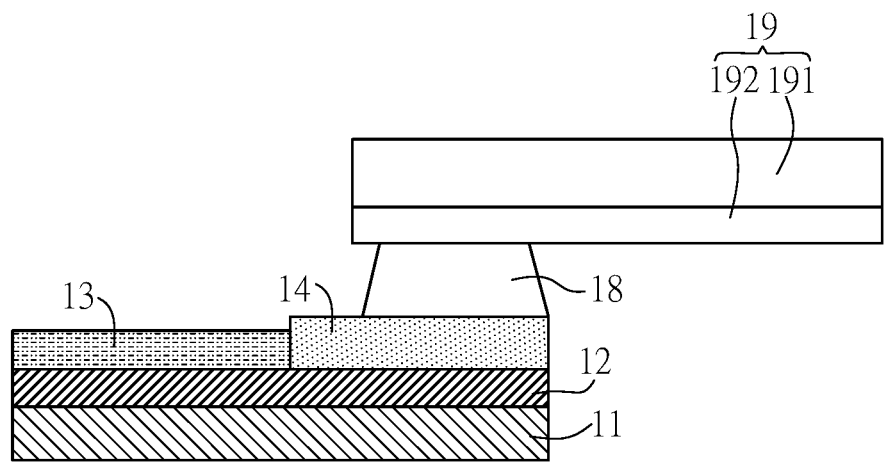
Figure 6B:
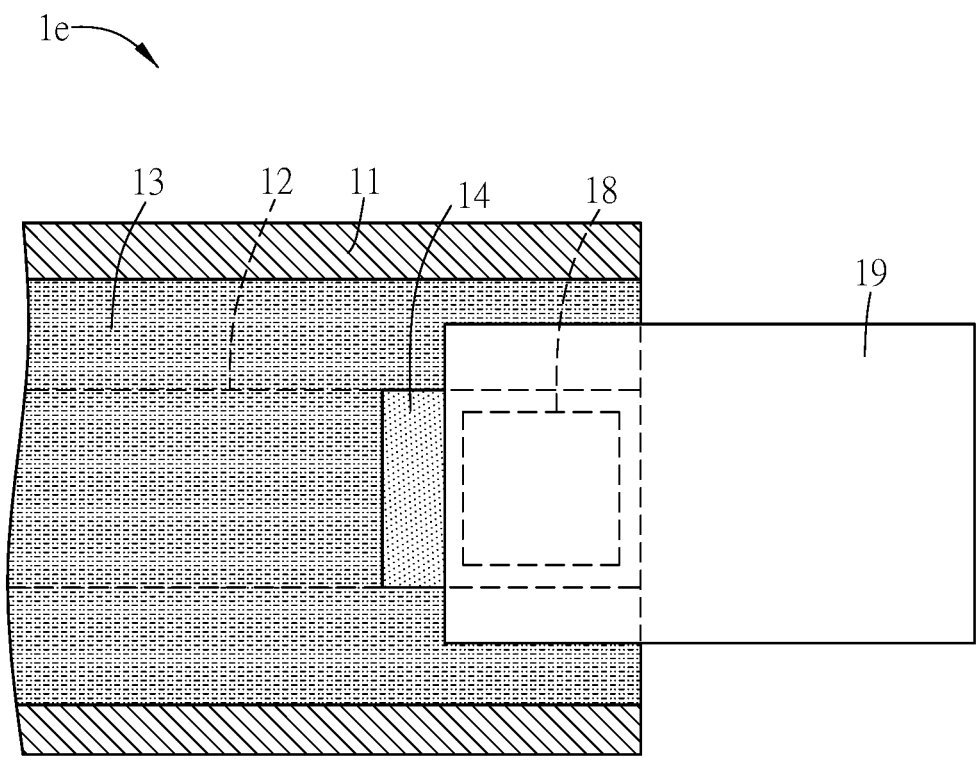

Furthermore, as shown in FIGS. 6A and 6B, the electronic element 19 of the electronic device 1e is a control circuit board for example. In this embodiment, the electronic element 19 (control circuit board) includes a substrate 191 and at least a conductive layer 192. The conductive layer 192 can be electrically connected with the thin-film conductive line 12 via the conductive material 18 (for example but not limited to ACF) and the electrical connection pad 14. In some embodiments, the substrate 191 is a flexible substrate, and the conductive layer 192 is a conductive film. Thus, the electronic element 19 can be a COF (chip on film). In some other embodiments, the substrate 191 is a hard substrate, and the conductive layer 192 is a copper layer, so that the electronic element 19 can be a printed circuit board. To be noted, during the process of electrically connecting the electronic element 19 (control circuit board) and the thin-film conductive line 12, a pressing step is needed to decrease the contact resistance and increase the conductivity, which may break the thin-film conductive line 12 and thus decrease the manufacturing yield. Therefore, in this embodiment, a thicker electrical connection pad 14 (greater than 3 μm) can be formed by the printing process for preventing the breaking of the thin-film conductive line 12 disposed on the substrate 11 caused by the pressing of the conductive layer 192 of the electronic element 19.

In addition, the other technical features of the electronic devices 1a~1e and the manufacturing methods thereof can be referred to the above-mentioned electronic device 1 and the manufacturing method thereof, so the detailed descriptions thereof will be omitted.

To sum up, in the electronic device and the manufacturing method thereof of this disclosure, at least a thin-film conductive line is formed on the substrate by a thin-film process, and at least an electrical connection pad electrically connected with the thin-film conductive line is formed on the substrate by a printing process. Afterwards, at least an electronic element is disposed on the substrate, and the electronic element can be electrically connected with the thin-film conductive line via the electrical connection pad. Since thin-film conductive line and the electrical connection pad are formed on the substrate by a thin-film process and a printing process, respectively, and the electronic element is electrically connected with the thin-film conductive line via the electrical connection pad, many fine lines can be manufactured based on this disclosure. Accordingly, this disclosure can decrease the manufacturing cost of the electronic device, increase the component configuration density, and improve the production yield and reliability of the electronic device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
a circuit board, comprising:
a substrate,
at least a thin-film conductive line disposed on the substrate, and
at least an electrical connection pad disposed on the substrate and electrically connected with the thin-film conductive line; and
at least an electronic element disposed on the electrical connection pad and electrically connected with the thin-film conductive line via the electrical connection pad,
wherein the electronic element is electrically connected with the electrical connection pad by eutectic bonding, the electrical connection pad directly contacts the thin-film conductive line, a thickness of the electrical connection pad is between 3 µm and 20 µm, a porosity of the electrical connection pad is greater than or equal to 5%, and is less than or equal to 40%.

2. The electronic device according to claim 1, wherein the substrate is a flexible substrate or a hard substrate.

3. The electronic device according to claim 2, wherein the flexible substrate comprises an organic polymer material, and a glass transition temperature of the organic polymer material is between 250° C. and 600° C.

4. The electronic device according to claim 1, wherein a width of at least a part of the thin-film conductive line is between 1 µm and 10 µm.

5. The electronic device according to claim 1, wherein a thickness of the thin-film conductive line is less than 3 m.

6. The electronic device according to claim 1, wherein a material of the electrical connection pad comprises copper powder and polymer material.

7. The electronic device according to claim 1, further comprising:
an insulation layer covering at least a part of the thin-film conductive line.

8. The electronic device according to claim 1, wherein the electrical connection pad comprises a body portion and an extension portion, the extension portion is extended in parallel with the substrate from the body portion, the electronic element is connected to the body portion, and the extension portion is connected to the thin-film conductive line.

9. The electronic device according to claim 8, wherein a width or a thickness of the body portion is different from a width or a thickness of the extension portion.

10. The electronic device according to claim 8, wherein the extension portion at least partially covers the thin-film conductive line.

11. The electronic device according to claim 1, wherein the electronic element is an SMD, an IC or a control circuit board.

12. The electronic device according to claim 1, further comprising:
a conductive material disposed on the substrate, wherein an electrode of the electronic element is electrically connected with the electrical connection pad and the thin-film conductive line via the conductive material.

13. The electronic device according to claim 1, wherein the electrical connection pad is a single-structured layer.

14. The electronic device according to claim 13, wherein a material of the electrical connection pad comprises copper powder.

15. A manufacturing method of an electronic device, comprising steps of:
forming at least a thin-film conductive line on a substrate by a thin-film process;
forming at least an electrical connection pad on the substrate by a printing process, wherein the electrical connection pad is electrically connected with the thin-film conductive line; and
disposing at least an electronic element on the substrate, wherein the electronic element is electrically connected with the thin-film conductive line through the electrical connection pad,
wherein the electronic element is electrically connected with the electrical connection pad by eutectic bonding, the electrical connection pad directly contacts the thin-film conductive line, a thickness of the electrical connection pad is between 3 µm and 20 µm, a porosity of the electrical connection pad is greater than or equal to 5%, and is less than or equal to 40%.

16. The manufacturing method according to claim 15, further comprising a step of:
forming the substrate on a rigid carrier plate.

17. The manufacturing method according to claim 15, wherein the printing process is a non-vacuum printing process.

18. The manufacturing method according to claim 15, further comprising a step of:
forming an insulation layer on the substrate, wherein the insulation layer at least partially covers the thin-film conductive line.

19. The manufacturing method according to claim 16, further comprising a step of:
performing multiple times of the printing process for increasing a width or the thickness of the electrical connection pad.

20. The manufacturing method according to claim 15, wherein the electrical connection pad is a single-structured layer, and a material of the electrical connection pad comprises copper powder.

* * * * *